US008327796B2

(12) United States Patent
Hirayama et al.

(10) Patent No.: US 8,327,796 B2
(45) Date of Patent: Dec. 11, 2012

(54) PLASMA PROCESSING APPARATUS AND PLASMA PROCESSING METHOD

(75) Inventors: Masaki Hirayama, Sendai (JP); Tadahiro Ohmi, Sendai (JP)

(73) Assignees: Tokyo Electron Limited (JP); Tohoku University (JP)

( * ) Notice: Subject to any disclaimer, the term of this patent is extended or adjusted under 35 U.S.C. 154(b) by 209 days.

(21) Appl. No.: 12/997,180

(22) PCT Filed: Jun. 3, 2009

(86) PCT No.: PCT/JP2009/060158
§ 371 (c)(1),
(2), (4) Date: Jan. 14, 2011

(87) PCT Pub. No.: WO2009/105978
PCT Pub. Date: Dec. 17, 2009

(65) Prior Publication Data
US 2011/0121736 A1    May 26, 2011

(30) Foreign Application Priority Data
Jun. 11, 2008    (JP) .................................. 2008-153423

(51) Int. Cl.
*C23C 16/00*    (2006.01)
(52) U.S. Cl. ... 118/723 MW; 118/723 ME; 156/345.36; 315/111.21; 315/39
(58) Field of Classification Search .......... 118/723 MW, 118/723 ME, 723 E, 723 ER; 156/345.33, 156/345.34, 345.36, 345.41, 345.46, 345.49; 315/111.21, 111.41, 111.71, 39
See application file for complete search history.

(56) References Cited

U.S. PATENT DOCUMENTS

| 7,325,511 | B2 * | 2/2008 | Goto et al. ............. 118/723 MW |
| 7,670,454 | B2 * | 3/2010 | Ohmi et al. .............. 156/345.41 |
| 7,754,995 | B2 * | 7/2010 | Nozawa et al. .......... 219/121.36 |
| 7,807,234 | B2 * | 10/2010 | Kitagawa ....................... 427/575 |
| 2003/0168012 | A1 | 9/2003 | Tamura et al. |
| 2004/0206729 | A1 | 10/2004 | Shinohara |
| 2007/0045244 | A1 | 3/2007 | Lee et al. |

FOREIGN PATENT DOCUMENTS

JP    06-077301    3/1994
(Continued)

OTHER PUBLICATIONS

International Search Report issued Aug. 4, 2009 re: PCT/JP2009/060158 citing JP6-349594, JP2007-59403, JP9-293599, JP10-70105, JP2004-235434, JP2003-332320, JP7-336115 and JP6-77301.

*Primary Examiner* — Haiss Philogene
(74) *Attorney, Agent, or Firm* — Cantor Colburn LLP

(57) ABSTRACT

Provided is a plasma processing apparatus having a coaxial waveguide structure in which characteristic impedance of an input side and characteristic impedance of an output side are different. A microwave plasma processing apparatus, which plasma-processes a substrate by exciting a gas by using a microwave, includes: a processing container; a microwave source, which outputs a microwave, a first coaxial waveguide, which transmits the microwave output from the microwave source; and a dielectric plate, which is adjacent to the first coaxial waveguide while facing an inner side of the processing container, and emits the microwave transmitted from the first coaxial waveguide into the processing container. A thickness ratio between an inner conductor and an outer conductor of the first coaxial waveguide is not uniform along a longitudinal direction.

22 Claims, 12 Drawing Sheets

FOREIGN PATENT DOCUMENTS

| | | |
|---|---|---|
| JP | 06-349594 | 12/1994 |
| JP | 07-336115 | 12/1995 |
| JP | 09-106900 | 4/1997 |
| JP | 09-293599 | 11/1997 |
| JP | 10-070105 | 3/1998 |
| JP | 2003-332320 | 11/2003 |
| JP | 2004-235434 | 8/2004 |
| JP | 2007-059403 | 3/2007 |

* cited by examiner

CROSS-SECTIONAL VIEW TAKEN ALONG LINE 1-1

PLASMA PROCESSING APPARATUS AND PLASMA PROCESSING METHOD

TECHNICAL FIELD

The present invention relates to a plasma processing apparatus and a plasma processing method, wherein plasma is generated by using electromagnetic waves and a plasma process is performed on an object to be processed, and more particularly, to impedance matching of a transmission path.

BACKGROUND ART

In a microwave plasma processing apparatus, in order to generate plasma by exciting a gas, a desired microwave as energy for ionizing or dissociating the gas is transmitted to a transmission path, and is emitted into a processing container. In the plasma processing apparatus having a structure wherein a gas passage is formed on a ceiling surface of the processing container and the gas is introduced into the processing container from the ceiling surface by using the ceiling surface as a shower plate, a thickness of a coaxial waveguide is difficult to be increased since a gas passage has to be formed in a location that does not interfere with the coaxial waveguide for transmitting the microwave.

Meanwhile, a considerable amount of power is required to stably generate uniform plasma. For example, since hundreds of W to several kW of microwaves have to be transmitted to the coaxial waveguide so as to excite high density plasma, a current density of an inner conductor of the coaxial waveguide is increased, and thus the inner conductor is heated up. When the inner conductor of the coaxial waveguide is heated up, a Teflon® ring or the like holding the inner conductor may be deformed or deteriorated, a surface of the inner conductor may be oxidized, or the inner conductor may be damaged as the inner conductor extends and stress is applied to each portion of the inner conductor.

In order to supply microwaves having large power to plasma while preventing the coaxial waveguide from being damaged, characteristic impedance of the coaxial waveguide is required to be optimized in each portion so as to suppress reflection of the microwaves to a minimum. However, in a conventional plasma processing apparatus, a coaxial waveguide having a simple structure and a uniform thickness is used to supply microwaves into a processing container (for example, refer to Patent Document 1). Accordingly, characteristic impedance is uniform along a longitudinal direction of the coaxial waveguide.

(Patent Document 1) Japanese Laid-Open Patent Publication No. hei 9-106900

DISCLOSURE OF THE INVENTION

Technical Problem

When a thickness of a dielectric plate disposed on the ceiling surface of the processing container and emitting the microwave transmitted through the coaxial waveguide into the processing container is thin, uniformity of the plasma may be increased. However, it is required to suppress characteristic impedance of an output side of the coaxial waveguide (a plasma side end portion of the coaxial waveguide) adjacent to the dielectric plate to about 10 to 20Ω in order to reduce the reflection of the microwave from the plasma side. Accordingly, in order to supply high power, characteristic impedance of an input side of the coaxial waveguide (a microwave source side end portion of the coaxial waveguide) adjacent to the dielectric plate needs to be higher than 10 to 20Ω. Accordingly, in a conventional coaxial waveguide having a uniform thickness, that is, uniform characteristic impedance along a longitudinal direction, reflection of the microwave from the plasma side is large and thus large power cannot be transmitted.

To address the above and/or other problems, the present invention provides a plasma processing apparatus having a coaxial waveguide structure in which characteristic impedances on an input side and an output side are different.

Technical Solution

According to an aspect of the present invention, there is provided a plasma processing apparatus for plasma-processing an object to be processed by exciting a gas by using an electromagnetic wave, the plasma processing apparatus including: a processing container; an electromagnetic wave source, which outputs an electromagnetic wave; a first coaxial waveguide, which has a structure in which a thickness ratio between an inner conductor and an outer conductor is not uniform along a longitudinal direction and transmits the electromagnetic wave output from the electromagnetic wave source; and a dielectric plate, which faces an inner side of the processing container and is adjacent to the first coaxial waveguide to emit the electromagnetic wave transmitted from the first coaxial waveguide into the processing container.

Characteristic impedance of a coaxial waveguide changes according to a change of a thickness ratio between an inner conductor and an outer conductor of the coaxial waveguide. Accordingly, in a structure of the first coaxial waveguide, in which the thickness ratio of the inner conductor and the outer conductor is not uniform along the longitudinal direction, characteristic impedance of the first coaxial waveguide is not uniform along the longitudinal direction. Thus, characteristic impedance of an input side of the first coaxial waveguide and characteristic impedance of an output side of the first coaxial waveguide may be different.

The thickness ratio between the inner conductor and the outer conductor of the first coaxial waveguide may be determined in such a way that characteristic impedance of an electromagnetic wave input side of the first coaxial waveguide is higher than characteristic impedance of an electromagnetic wave output side of the first coaxial waveguide. Accordingly, reflection of an electromagnetic wave from a plasma side may be suppressed to be small while transmitting large power to a coaxial waveguide.

In the structure of the first coaxial waveguide, in which the thickness ratio of the inner conductor and the outer conductor is not uniform along the longitudinal direction, for example, a thickness of the input side of the inner conductor of the first coaxial waveguide may become narrower than a thickness of the output side of the inner conductor of the first coaxial waveguide. Here, the inner conductor of the first coaxial waveguide may continuously become thicker from the input side toward the output side along the longitudinal direction of the first coaxial waveguide.

A thickness of an input side of the inner conductor of the first coaxial waveguide may be thinner than a thickness of an output side of the inner conductor of the first coaxial waveguide. Here, the outer conductor of the first coaxial waveguide may continuously become narrower from the input side to the output side along the longitudinal direction of the first coaxial waveguide. Alternatively, a stepped part may be formed on at least one of the inner conductor and the outer conductor of the first coaxial waveguide, and the thickness ratio between the inner conductor and the outer conductor of the fist coaxial waveguide may be discontinuously changed by the stepped part.

As shown in FIG. 12, a shape of the first coaxial waveguide is optimized in such a way that the characteristic impedance of the input side of the first coaxial waveguide is from 18Ω to 46Ω, so that large power is supplied even to a narrow coaxial waveguide. Referring to FIG. 12, when the characteristic impedance of the input side of the first coaxial waveguide is limited to 22Ω to 40Ω, larger power may be supplied.

The inner conductor of the first coaxial waveguide may have a narrowed portion that is partially narrowed. This is equivalent to insert an inductance into the first coaxial waveguide in series, and a value of the inserted inductance may be optimized according to a diameter or a length of the narrowed portion, thereby suppressing the reflection.

A dielectric ring may be disposed adjacent to the dielectric plate, between the inner conductor and the outer conductor of the first coaxial waveguide. This is equivalent to insert a capacitance into the first coaxial waveguide in parallel, and a value of the inserted capacitance may be optimized according to a thickness or permittivity of the dielectric ring, thereby suppressing the reflection. Also, by filling a gap near the dielectric plate by using the dielectric ring, an electric field may be prevented from being centered on a location near the first coaxial waveguide and the dielectric plate, thereby preventing an abnormal discharge.

A first dielectric supporting member may be disposed between the inner conductor and the outer conductor of the first coaxial waveguide, and the first dielectric supporting member may be inserted into a groove formed on a periphery of the inner conductor of the first coaxial waveguide. Accordingly, the inner conductor of the first coaxial waveguide is supported by the outer conductor. Also, this is equivalent to insert the capacitance into the first coaxial waveguide in parallel, and the value of the inserted capacitance may be optimized according to the thickness or permittivity of the dielectric ring, thereby suppressing the reflection.

The plasma processing apparatus may further include: a second coaxial waveguide, which is connected to the first coaxial waveguide and transmits the electromagnetic wave to the first coaxial waveguide; and a spring member, which is disposed at a connecting portion between the inner conductor of the first coaxial waveguide and an inner conductor of the second coaxial waveguide and pushes the inner conductor of the first coaxial waveguide to the dielectric plate directly or indirectly by interposing another member. Accordingly, transmission of the electromagnetic wave may be stabilized by pushing and adhering the inner conductor of the first coaxial waveguide to the dielectric plate directly or indirectly by interposing another member, by using an elastic force of the spring member.

A connecting member, which electrically connects the inner conductor of the first coaxial waveguide and the inner conductor of the second coaxial waveguide, may be disposed at the connecting portion between the inner conductor of the first coaxial waveguide and the inner conductor of the second coaxial waveguide.

The inner conductor of the second coaxial waveguide may be thicker than the inner conductor of the first coaxial waveguide. The connecting portion may have a clearance for changing an angle of the inner conductor of the first coaxial waveguide with respect to the inner conductor of the second coaxial waveguide. Accordingly, the plasma processing apparatus is easily assembled.

A second dielectric supporting member may be disposed between the inner conductor and an outer conductor of the second coaxial waveguide, and the second dielectric supporting member may be inserted into a groove formed on a periphery of the inner conductor of the second coaxial waveguide. Accordingly, the inner conductor of the second coaxial waveguide is supported by the outer conductor.

A dielectric rod may be disposed between the inner conductor and the outer conductor of the second coaxial waveguide near the connecting portion, and the dielectric rod may be inserted into a hole formed on the inner conductor of the second coaxial waveguide. Accordingly, the inner conductor of the second coaxial waveguide is supported by the outer conductor.

A catching portion, which prevents the inner conductor of the first coaxial waveguide from falling from the inner conductor of the second coaxial waveguide, may be formed in the connecting portion.

A metal part may be disposed between and adjacent to the inner conductor of the first coaxial waveguide and the dielectric plate. Accordingly, the transmission of the electromagnetic wave is prevented from being scattered by increasing adhesion between the inner conductor of the first coaxial waveguide and the dielectric plate by using the metal part.

In the connecting portion, the characteristic impedance of the first coaxial waveguide and the characteristic impedance of the second coaxial waveguide may be identical. Accordingly, the reflection of the electromagnetic wave transmitted to the connecting portion may be suppressed.

According to another aspect of the present invention, there is provided a plasma processing method including: introducing a gas to an inner side of a processing container; outputting an electromagnetic wave from an electromagnetic wave source; transmitting the output electromagnetic wave to a first coaxial waveguide having a structure in which a thickness ratio between an inner conductor and an outer conductor is not uniform along a longitudinal direction; emitting the electromagnetic wave received through the first coaxial waveguide, from a dielectric plate, which faces an inner side of the processing container and is adjacent to the first coaxial waveguide, into the inner side of the processing container; and plasma-processing an object to be processed by exciting the introduced gas, with the emitted electromagnetic wave.

Accordingly, reflection of the electromagnetic wave from a plasma side may be suppressed to be small while transmitting large power to a coaxial waveguide, by using the first coaxial waveguide having a structure in which characteristic impedance is not uniform along the longitudinal direction.

Advantageous Effects

As described above, according to the present invention, characteristic impedances of an input side and an output side of a coaxial waveguide may be different from each other.

BEST MODE FOR CARRYING OUT THE INVENTION

Figure 1:
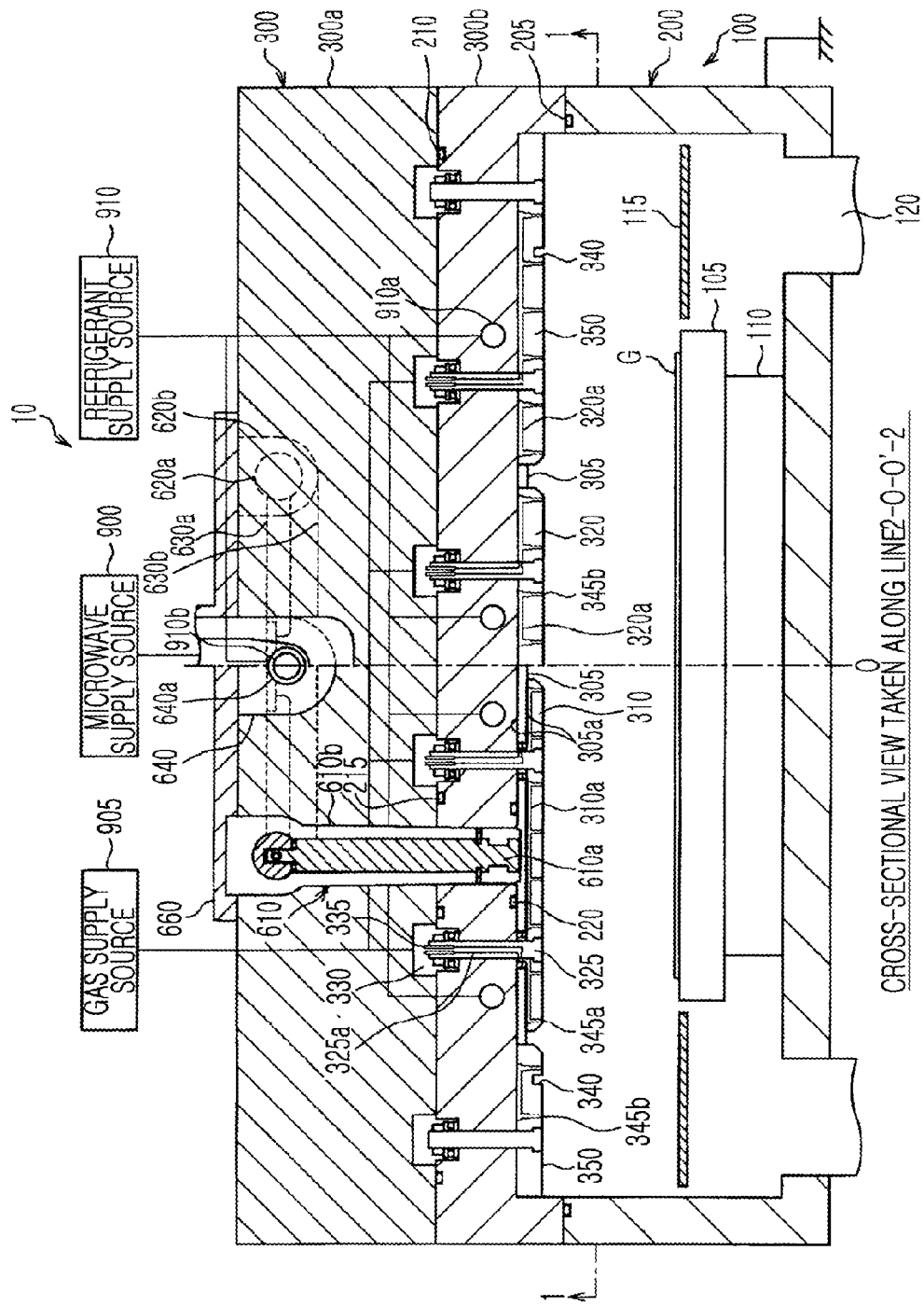
FIG. 1 is a longitudinal-sectional view (cross-sectional view taken along a line 2-O-O'-2 of FIG. 2) of a microwave plasma processing apparatus according to an embodiment of the present invention.

Hereinafter, the present invention will be described in detail by explaining exemplary embodiments of the invention with reference to the attached drawings. Like reference numerals in the drawings denote like elements, and overlapping descriptions thereof will be omitted.

Embodiment 1

Figure 2:
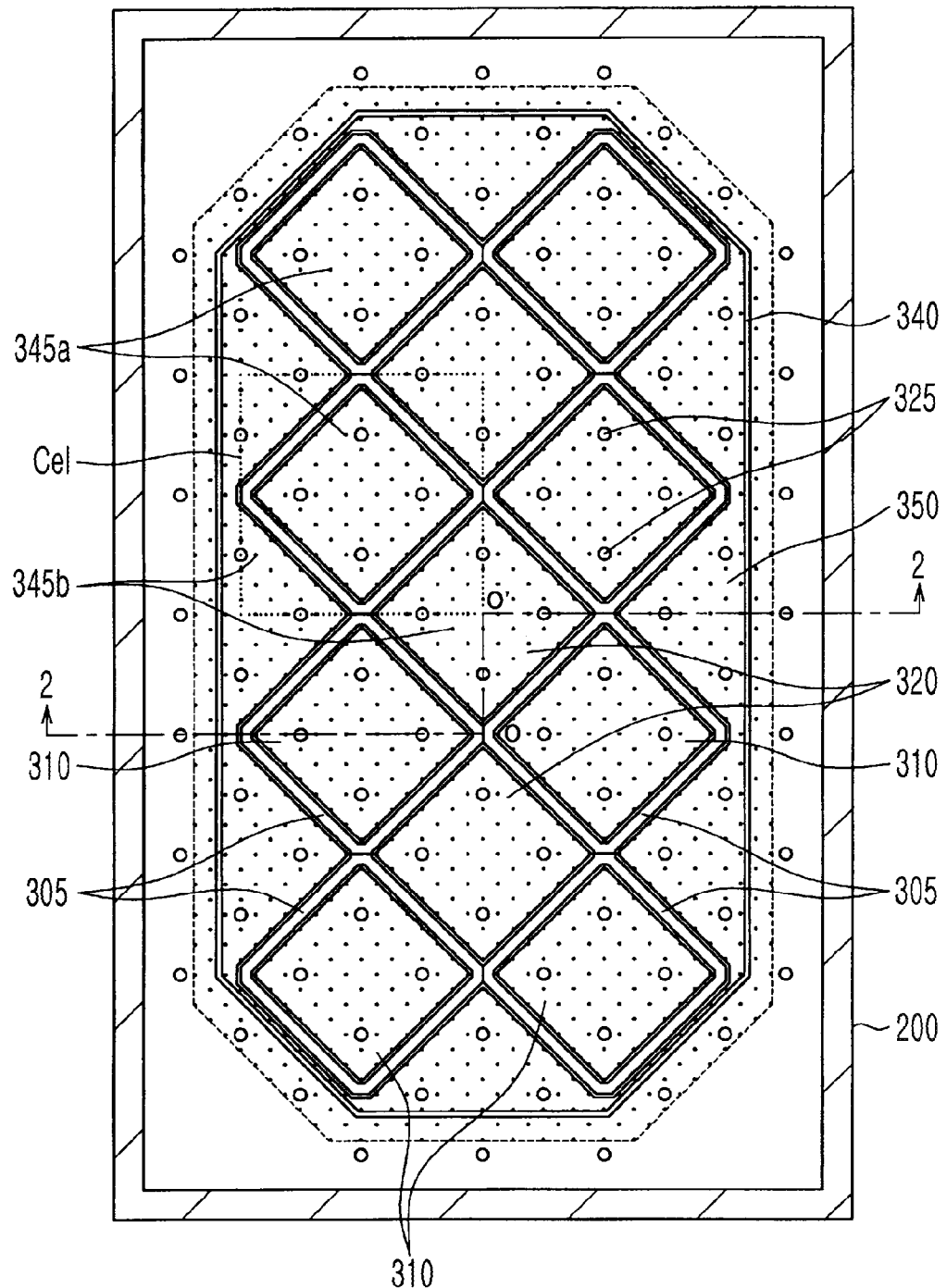
FIG. 2 is a cross-sectional view taken along a line 1-1 of FIG. 1.

A structure of a microwave plasma processing apparatus according to an embodiment 1 of the present invention will now be described with reference to FIGS. 1 and 2. FIG. 1 is a longitudinal-sectional view of a microwave plasma processing apparatus 10 according to the present embodiment. FIG. 1 is a cross-sectional view taken along a line 2-O-O'-2 of FIG. 2. FIG. 2 shows a ceiling surface of the present apparatus 10, and is cross-sectional view taken along a line 1-1 of FIG. 1.

(Outline of Microwave Plasma Processing Apparatus)

As shown in FIG. 1, the microwave plasma processing apparatus 10 includes a processing container 100 for plasma-processing a glass substrate (hereinafter, referred to as a substrate G). The processing container 100 includes a container body 200 and a lid 300. The container body 200 has a cube shape having an opened top and a closed bottom, wherein the opened top is closed by the lid 300. The lid 300 is formed of an upper lid 300a and a lower lid 300b. An O-ring 205 is disposed on a contacting surface between the container body 200 and the lower lid 300b, and accordingly, the container body 200 and the lower lid 300b are sealed, thereby defining a processing chamber. An O-ring 210 and an O-ring 215 are also disposed on a contacting surface between the upper lid 300a and the lower lid 300b, and accordingly, the upper lid 300a and the lower lid 300b are sealed. The container body 200 and the lid 300 are formed of a metal, such as an aluminum alloy, or the like, and are electrically grounded.

A susceptor 105 (stage) on which the substrate G is placed is provided inside the processing container 100. The susceptor 105 is formed of, for example, aluminum nitride. The susceptor 105 is supported by a supporter 110, and a baffle plate 115 for controlling a flow of a gas of the processing chamber in a desirable state is provided around the susceptor 105. A gas exhaust pipe 120 is provided at a bottom part of the processing container 100, and a gas inside the processing container 100 is exhausted by using a vacuum pump (not shown) disposed outside the processing container 100.

Referring to FIGS. 1 and 2, dielectric plates 305, metal electrodes 310, and metal covers 320 are regularly disposed on the ceiling surface of the processing container 100. Side covers 350 are disposed around the metal electrodes 310 and the metal covers 320. The dielectric plate 305, the metal electrode 310, and the metal cover 320 are each a plate having a rough square shape in which corners are slightly cut. Alternatively, the dielectric plate 305, the metal electrode 310, and the metal cover 320 may each have a diamond shape. The metal electrode 310 is a flat plate disposed adjacent to the dielectric plate 305 so that the dielectric plate 305 is generally evenly exposed from a peripheral portion of the metal electrode 310. Accordingly, the dielectric plate 305 is sandwiched by an inner wall of the lid 300 and the metal electrode 310. The metal electrode 310 is electrically connected to an inner wall of the processing container 100.

8 dielectric plates 305 and 8 metal electrodes 310 are disposed at regular pitches at a location inclining about 45° with respect to the substrate G or the processing container 100. Here, a pitch is determined in such a way that a diagonal length of one dielectric plate 305 is about 0.9 times or above a distance between the centers of neighboring dielectric plates 305. Accordingly, the slightly cut corners of the dielectric plates 305 are adjacently disposed.

Regarding the metal electrode 310 and the metal cover 320, the metal cover 320 is thicker as much as the thickness of the dielectric plate 305. As such, heights of the ceiling surface are almost same, and at the same time, an exposed portion of the dielectric plate 305 or dented shapes near the dielectric plate 305 all have almost the same pattern.

The dielectric plate 305 is formed of alumina, and the metal electrode 310, the metal cover 320, and the side cover 350 are formed of an aluminum alloy. Also, in the present embodiment, the 8 dielectric plates 305 and the 8 metal electrodes 310 are disposed in 2 rows and 4 columns, but numbers of the dielectric plates 305 and metal electrodes 310 are not limited thereto, and may be increased or decreased.

The dielectric plate 305 and the metal electrode 310 are evenly supported by screws 325 from 4 locations (refer to FIG. 2). As shown in FIG. 1, a main gas passage 330 having a lattice shape in a direction perpendicular to the ground is formed between the upper lid 300a and the lower lid 300b. The main gas passage 330 distributes the gas to a gas passage 325a formed in the plurality of screws 325. A tubule 335 for narrowing a passage is inserted in an inlet of the gas passage 325a. The tubule 335 is formed of ceramic or a metal. A gas passage 310a is formed between the metal electrode 310 and the dielectric plate 305. A gas passage 320a is also formed between the metal cover 320 and the dielectric plate 305 and between the side cover 350 and the dielectric plate 305. A front end surface of the screw 325 forms one plane with bottom surfaces of the metal electrode 310, metal cover 320, and side cover 350, so as not to scatter distribution of plasma. Gas discharging holes 345a opened on the metal electrode 310 and gas discharging holes 345b opened on the metal cover 320 or the side cover 350 are formed at regular pitches.

A gas output from a gas supply source 905 passes from the main gas passage 330 to the gas passage 325a (branch gas passage), passes through the first gas passage 310a in the metal electrode 310 and the second gas passage 320a in the metal cover 320 or the side cover 350, and is supplied from the gas discharging holes 345a and 345b into the processing chamber. An O-ring 220 is disposed on a contacting surface between the lower lid 300b and the dielectric plate 305 near a periphery of a first coaxial waveguide 610, and thus the air inside the first coaxial waveguide 610 does not enter an inner side of the processing container 100.

As such, by forming a gas shower plate on a metal surface of a ceiling portion, etching of a dielectric plate surface due to ions in plasma, and deposition of reaction products on an inner wall of a processing container, which were conventionally generated, are suppressed, thereby promoting reduction of contamination or particles. Also, unlike a dielectric substance, a metal is easily processed, and thus expenses may be remarkably reduced.

An inner conductor 610a is inserted into an outer conductor 610b of the first coaxial waveguide formed by excavating the lid 300. Inner conductors 620a through 640a of second through fourth coaxial waveguides are respectively inserted into outer conductors 620b through 640b of the second through fourth coaxial waveguides that are formed by excavating the lid 300, and tops of the first coaxial waveguide 610 and the second through fourth coaxial waveguides are covered by a lid cover 660. The inner conductors of each coaxial waveguide are formed of copper having good thermal conductivity.

The surface of the dielectric plate 305 shown in FIG. 1 is coated by a metal film 305a except an area where a microwave is incident on the dielectric plate 305 from the first coaxial waveguide 610 and an area where the microwave is emitted from the dielectric plate 305. Accordingly, propagation of the microwave is not scattered even by a gap generated between the dielectric plate 305 and a member near the dielectric plate 305, and thus the microwave may be stably introduced into the processing container.

As shown in FIG. 2, the dielectric plate 305 is exposed from between the metal electrode 310 adjacent to the dielectric plate 305 in one-to-one correspondence, and the inner wall (including the inner wall of the processing container 100 covered by the metal cover 320) of the processing container 100 where the dielectric plate 305 is not disposed. A shape of the dielectric plate 305 and a shape of the inner wall(including the inner wall of the processing container 100 covered by the metal cover 320) of the processing container 100 where the dielectric plate 305 is not disposed are substantially similar or symmetrical. Accordingly, power of the microwave may be generally uniformly supplied from the dielectric plate to the metal electrode side and the inner wall side (metal cover 320 and side cover 350 sides). As a result, the microwave emitted from the dielectric plate 305 becomes a surface wave to distribute power into halves while propagating surfaces of the metal electrode 310, metal cover 320, and side cover 350. A surface wave propagating between a metal surface of an inner surface of the processing container and plasma will now be referred to as a conductor surface wave (metal surface wave). Accordingly, by propagating the entire ceiling surface using the conductor surface wave, plasma is uniformly and stably generated below the ceiling surface of the microwave plasma processing apparatus 10 according to the present embodiment.

In the side cover 350, a groove 340 having an octagonal shape is formed to surround the entire 8 dielectric plates 305, and thus the conductor surface wave propagating the ceiling surface is suppressed from propagating an outer side of the groove 340. A plurality of grooves 340 may be multiply formed in parallel.

An area having a center point of the adjacent metal cover 320 around one piece of metal electrode 310 as a vertex will now be referred to as a cell Cel (refer to FIG. 2). In the ceiling surface, one cell Cel is used as one unit, and 8 cells Cel are regularly arranged, wherein the 8 cells Cel have the same pattern.

A refrigerant supply source 910 is connected to a refrigerant pipe 910a inside the lid, and a refrigerant pipe 910b of the inner conductor 640a of the fourth coaxial waveguide. Overheating of the lid 300 and the inner conductor is suppressed as a refrigerant supplied from the refrigerant supply source 910 circulates inside the refrigerant pipes 910a and 910b, and returns back to the refrigerant supply source 910.

(Fixation of Inner Conductor of Coaxial Waveguide)

Figure 3:
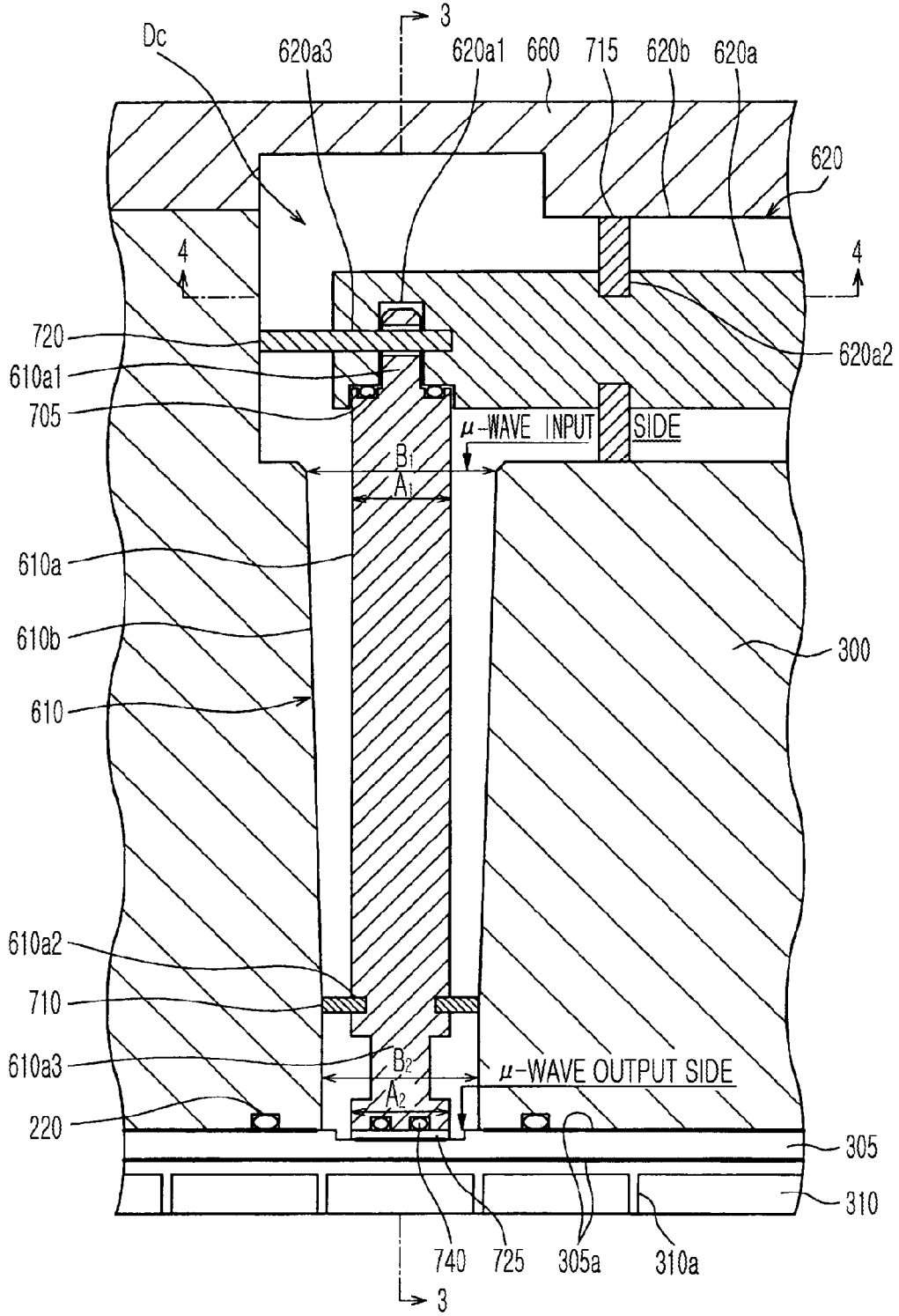
FIG. 3 is a magnified view of a first coaxial waveguide and the vicinity of the first coaxial waveguide, according to an embodiment 1 of the present invention.
Figure 4:
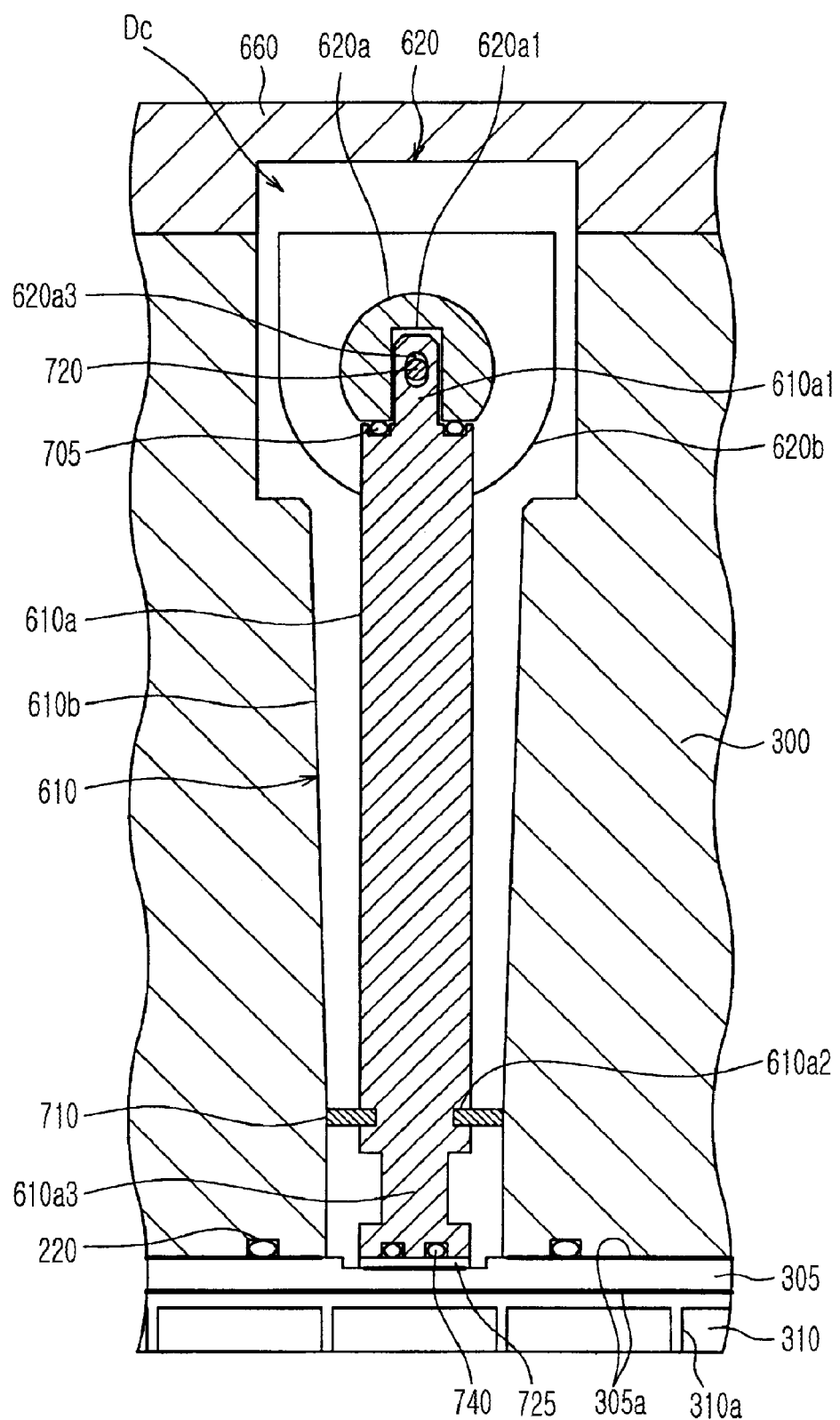
FIG. 4 is a cross-sectional view taken along a line 3-3 of FIG. 3.
Figure 5:
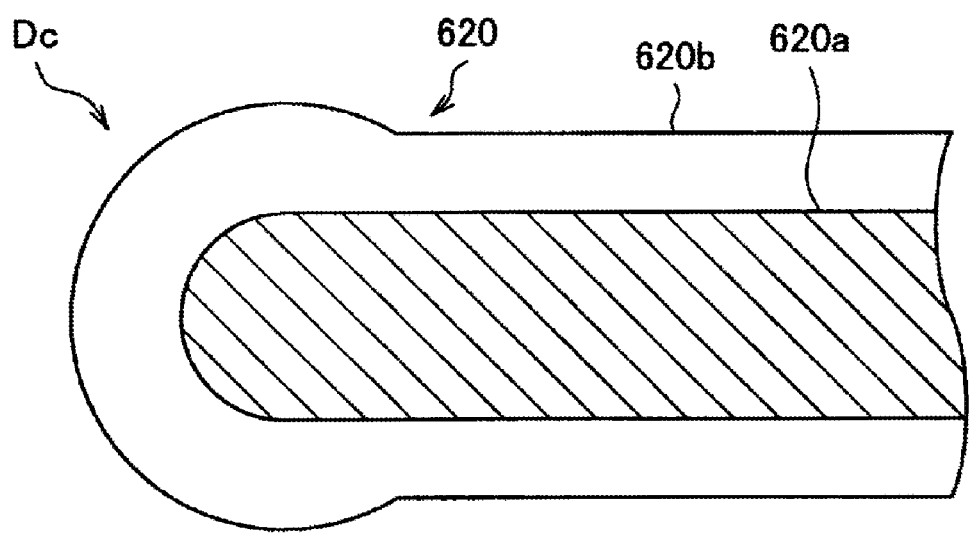
FIG. 5 is a cross-sectional view taken along a line 4-4 of FIG. 3.

First and second coaxial waveguides and a connecting portion between the first and second coaxial waveguides will now be described with reference to FIGS. 3 through 5. FIG. 3 is a cross-sectional view of first and second coaxial waveguides 610 and 620, and a connecting portion Dc. FIG. 4 is a cross-sectional view taken along a line 3-3 of FIG. 3, and FIG. 5 is a cross-sectional view taken along a line 4-4 of FIG. 3.

As described above, the first coaxial waveguide 610 is formed of the inner conductor 610a and the outer conductor 610b. Similarly, the second coaxial waveguide 620 is formed of the inner conductor 620a and the outer conductor 620b. The inner conductors of the first and second coaxial waveguides 610 and 620 are all formed of copper. The outer conductors 610b and 620b are defined by excavated portions formed on the lid 300 and the lid cover 660. The first and second coaxial waveguides 610 and 620 are connected by the connecting portion Dc substantially perpendicular to each other.

In the connecting portion Dc, a rod 610a1 formed in front end of the inner conductor 610a of the first coaxial waveguide is inserted into a perpendicular hole 620a1 having a bottom and formed on a bottom surface of the second coaxial waveguide.

A dielectric ring 710 (an example of a first dielectric supporting member) is inserted into a groove 610a2 formed on a periphery of the inner conductor 610a of the first coaxial waveguide, and accordingly, the inner conductor 610a is supported by the outer conductor 610b, thereby preventing shaft shaking of the inner conductor 610a.

A dielectric ring 715 (an example of a second dielectric supporting member) is also inserted into a groove 620a2 formed on a periphery of the inner conductor 620a of the second coaxial waveguide, and accordingly, the inner conductor 620a is supported by the outer conductor 620b. The dielectric rings 710 and 715 may be formed of, for example, Teflon®.

A side of the inner conductor 620a of the second coaxial waveguide is also supported by a dielectric rod 720. The dielectric rod 720 is inserted into a horizontal hole 620a3 having a bottom and formed on the inner conductor 620a of the second coaxial waveguide, is penetrated through a horizontal hole formed on the rod 610a1, and is inserted to bottom of the horizontal hole 620a3.

As such, the inner conductor 610a of the first coaxial waveguide is fixed to the inner conductor 620a of the second coaxial waveguide 620 by the dielectric rod 720. Accordingly, it is easy to assemble a plasma display device, since the inner conductor 610a of the first coaxial waveguide and the inner conductor 620a of the second coaxial waveguide which are connected to each other may be inserted into the excavated portion formed on the lid 300. Also, the inner conductors 610a and 620a of the first and second coaxial waveguides are connected and fixed to each other without using a screw, and thus the inner conductor 610a of the first coaxial waveguide is prevented from falling from the inner conductor 620a of the second coaxial waveguide. Also, the dielectric rod 720 is an example of a catching portion for preventing the inner conductor 610a of the first coaxial waveguide from falling from the inner conductor 620a of the second coaxial waveguide.

The horizontal hole formed in the rod 610a1 is a long perpendicular hole, and enables the inner conductor 610a of the first coaxial waveguide to move up and down a little. Accordingly, the inner conductor 610a definitely contacts the dielectric plate 305. Also, a gap is formed between the perpendicular hole 620a1 of the second coaxial waveguide and the rod 610a1, and thus an angle of the inner conductor 610a of the first coaxial waveguide may be somewhat changed with respect to the inner conductor 620a. If there is no clearance when the inner conductors 610a and 620a which are connected to each other are inserted into the outer conductors 620a and 620b, a stress is applied as the Teflon® ring 710 and the outer conductor 610b of the first coaxial waveguide contact each other, due to a minute size difference of each portion.

A flat surface is formed on a portion of the inner conductor 620a of the second coaxial waveguide, contacting the inner conductor 610a of the first coaxial waveguide, and the inner conductors 610a and 620a are definitely electrically connected to each other by a shield spiral 705. Also, a gap between the inner conductor 610a of the first coaxial waveguide and the dielectric plate 305 is prevented from being opened by adhering the inner conductor 610a of the first coaxial waveguide to the dielectric plate 305 by using an elastic force of the shield spiral. The shield spiral 705 is an example of a connecting material electrically connecting the inner conductor 610a of the first coaxial waveguide and the inner conductor 620a of the second coaxial waveguide, and is an example of a spring member adhering the inner conductor 610a of the first coaxial waveguide to the dielectric plate 305.

However, with respect to a connecting portion of the inner conductor 610a of the first coaxial waveguide and the inner conductor 620a of the second coaxial waveguide, the inner conductors may be electrically connected to each other at a nearest possible portion of periphery surfaces of the inner conductors. If the inner conductors are electrically connected to each other from an inner side far from the periphery surfaces, an unstable reactance component is applied due to a partial gap generated between the inner conductors, thereby generating reflection.

As easily understood from FIG. 4, the inner conductor 620a of the second coaxial waveguide is formed to be thicker than the inner conductor 610a of the first coaxial waveguide so that the flat bottom surface of the inner conductor 620a of the second coaxial waveguide approaches the periphery surface. Thus, the inner conductors are electrically connected to each other by the shield spiral 705 near the periphery surfaces.

A front end of a dielectric substance side of the inner conductor 610a of the first coaxial waveguide meets a dent 305a formed on the dielectric plate 305, wherein a metal part 725 having a disk shape and formed of cooper is inserted therebetween. Adhesion between the inner conductor 610a of the first coaxial waveguide and the dielectric plate 305 may be increased by interposing the metal part 725.

As described above, the outer conductors 610b and 620b of the first and second coaxial waveguides are formed by excavating the lid 300 from the top. Thus, the outer conductor 620b of the second coaxial waveguide shown in FIG. 4 has a semicircular pillar shape, wherein a top is flat and a bottom is semicircular. Concentration of an electric field is suppressed to prevent an abnormal discharge, by forming the bottom of the outer conductor 620b in a semicircle and unifying a distance between the inner conductor 620a and the outer conductor 620b as much as possible.

In the connecting portion Dc, as shown in FIG. 3, a recess portion is formed on the bottom surface of the lid cover 660 so that an end of the outer conductor 610b protrudes above the second coaxial waveguide 620. Also, as shown in FIG. 5, a shape of the outer conductor 620b of the second coaxial waveguide is increased so as to form a wide space between the inner conductors 610a and 620a and the outer conductors 610b and 620b of the first and second coaxial waveguides. As such, reflection is not generated at the connecting portion Dc while transmitting the microwave from the second coaxial waveguide 620 to the first coaxial waveguide 610.

(Coaxial Waveguide Matching)

Figure 6:
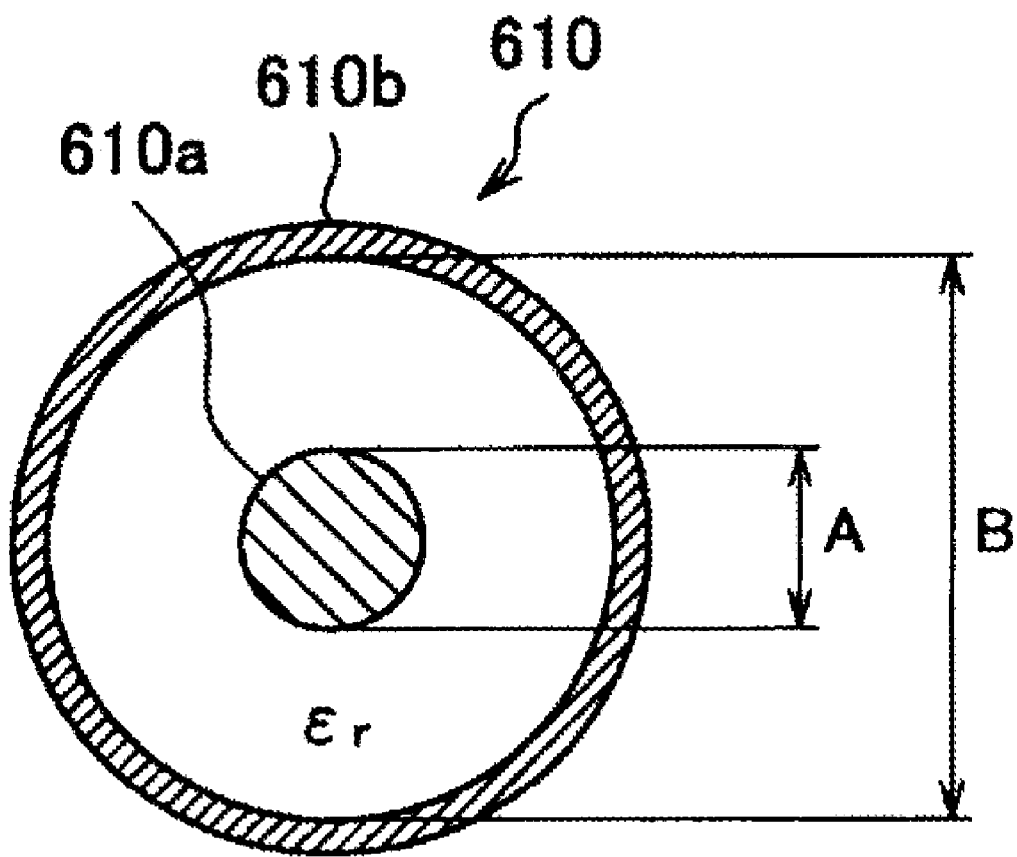
FIG. 6 is a view for describing a relationship between thickness ratio of an inner conductor to an outer conductor of a coaxial waveguide, and characteristic impedances.

Matching of characteristic impedance of the first coaxial waveguide 610 will now be described. As shown in FIG. 6, when A denotes a diameter of the inner conductor 610a of the first coaxial waveguide and B denotes a diameter (inner diameter) of the outer conductor 610b of the first coaxial waveguide, a relationship between characteristic impedance $Z_c$ of the first coaxial waveguide 610 and a thickness of the first coaxial waveguide 610 is represented by Equation 1 below.

$$Z_c = 138/\sqrt{\in_r} \times \log(B/A) \tag{1}$$

For example, when B/A=2.3, $\in_r$=1 in the atmosphere, and thus characteristic impedance $Z_c$ of a coaxial waveguide is 50 Ω.

In the first coaxial waveguide 610, a thickness ratio between the inner conductor 610a and the outer conductor 610b is not uniform along a longitudinal direction. For example, as shown in FIG. 3, a thickness (diameter A) of the inner conductor 610a of the first coaxial waveguide is uniform along the longitudinal direction ($A_1=A_2$), but a thickness (diameter B) of the outer conductor 610b continuously (slowly) decreases from a microwave input side to an output side along the longitudinal direction ($B_1>B_2$). Here, a diameter ratio ($B_1/A_1$) between the inner conductor 610a and the outer conductor 610b at the microwave input side of the first coaxial waveguide(an input side of the inner conductor 610a of the first coaxial waveguide, hereinafter, also simply referred to as an input side), and a diameter ratio ($B_2/A_2$) between the inner conductor 610a and the outer conductor 610b at the microwave output side of the inner conductor 610a of the first coaxial waveguide (an output side of the inner conductor 610a of the first coaxial waveguide, hereinafter, also simply referred to as an output side) satisfy $B_1/A_1>B_2/A_2$. As a result, according to Equation 1, characteristic impedance $Z_{c1}$ of the first coaxial waveguide 610 at the input side and characteristic impedance $Z_{c2}$ of the first coaxial waveguide 610 at the output side satisfy $Z_{c1}>Z_{c2}$.

Accordingly, in the present embodiment, the thickness ratio between the inner conductor 610a and the outer conductor 610b of the first coaxial waveguide differs at the input side and the output side of the first coaxial waveguide 610, and thus characteristic impedance of the first coaxial waveguide 610 is changed. Specifically, in the present embodiment, a thickness of the outer conductor 610b is gradually decreased, thereby gradually decreasing the characteristic impedance of the first coaxial waveguide 610. Accordingly, the reflection is difficult to be generated.

(Impedance Matching and Stepped Part)

For example, diameters of the inner conductor 610a and the outer conductor 610b are adjusted in such a way that the characteristic impedance of the input side of the first coaxial waveguide 610 is 30Ω and the characteristic impedance of the output side of the first coaxial waveguide 610 is 15Ω. Hereinafter, the output side of the first coaxial waveguide is referred to as a low characteristic impedance line of 15Ω, and the input side of the first coaxial waveguide is referred to as a high characteristic impedance line of 30Ω, and a method of connecting the low characteristic impedance line and the high characteristic impedance line will be described.

Figure 7:
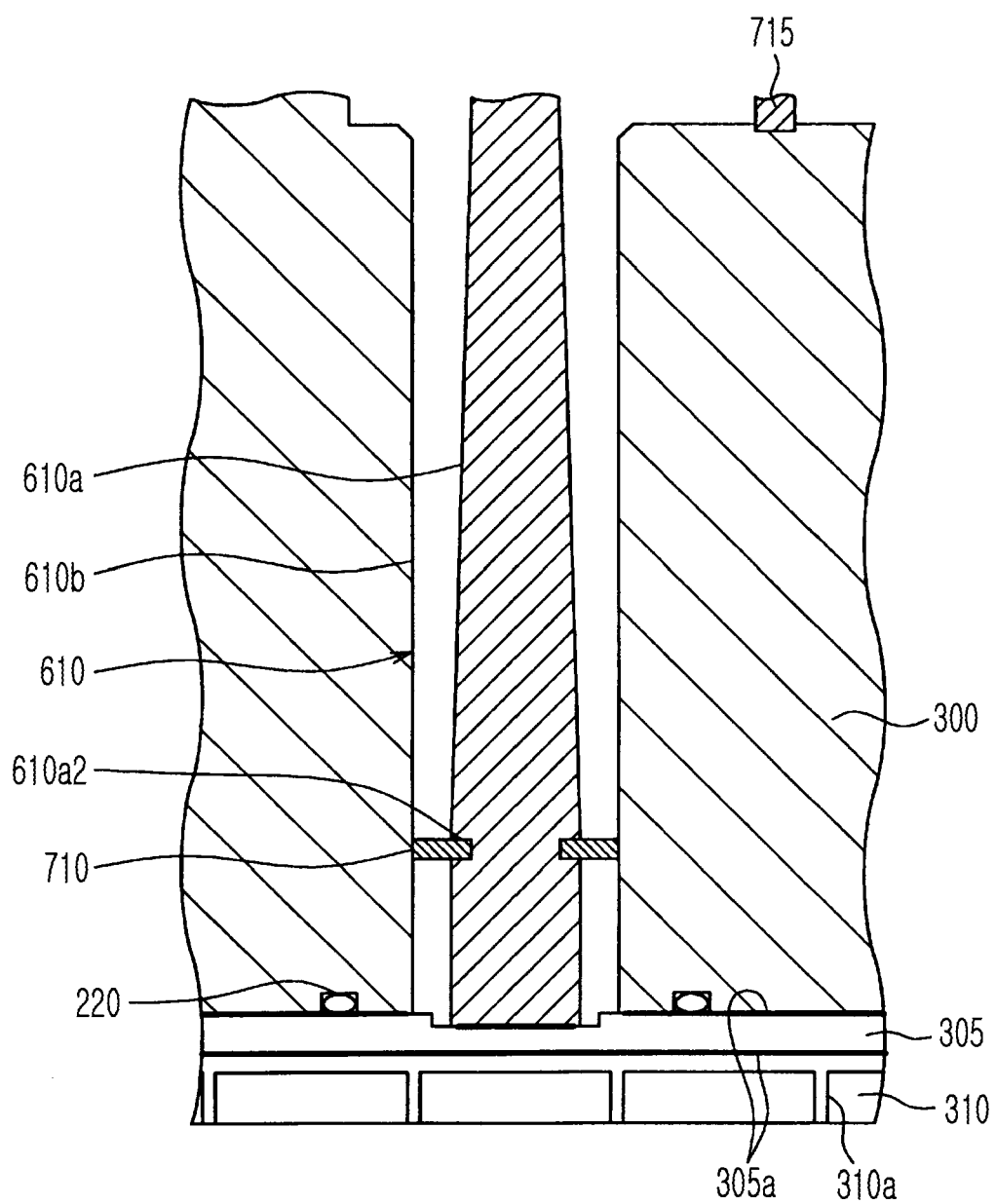
FIG. 7 is a view of a modified example of a shape of the first coaxial waveguide.

When anti-reflection is possible in the low characteristic impedance line, lines having different characteristic impedances may be connected to each other while suppressing reflection, by gradually changing characteristic impedance between the low characteristic impedance line and the high characteristic impedance line, as shown in FIG. 3 or 7.

In FIG. 3, the thickness (diameter B) of the outer conductor 610b of the first coaxial waveguide is continuously (gradually) decreased toward the microwave output side along the longitudinal direction, and the thickness (diameter A) of the inner conductor 610a is uniform along the longitudinal direction. Alternatively, as shown in FIG. 7, the thickness (diameter B) of the outer conductor 610b of the first coaxial waveguide may be uniform along the longitudinal direction, and the thickness (diameter A) of the inner conductor 610a may be continuously (gradually) increased toward the microwave output side along the longitudinal direction.

Figure 8:
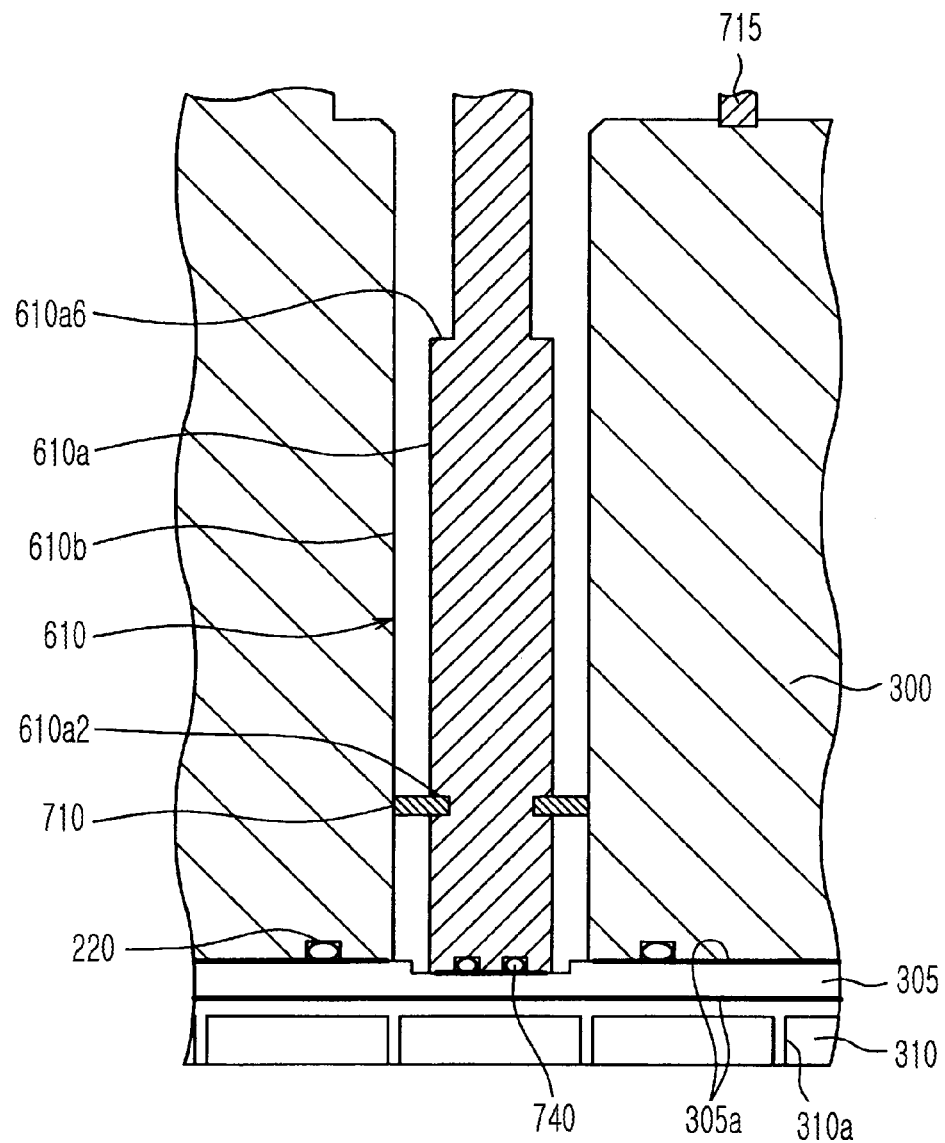
FIG. 8 is a view of a modified example of a shape of the first coaxial waveguide.

When the anti-reflection is not possible in the low characteristic impedance line (also said that the reflection is not large), the reflection may have the smallest value by adjusting a length of the low characteristic impedance line so that impedance observed from a stepped part 610a6 toward a low characteristic impedance line side is nearest to the characteristic impedance of the high characteristic impedance line, by forming, for example, the stepped part 610a6 on the inner conductor 610a as shown in FIG. 8, or forming a stepped part (not shown) on the outer conductor.

Figure 9:
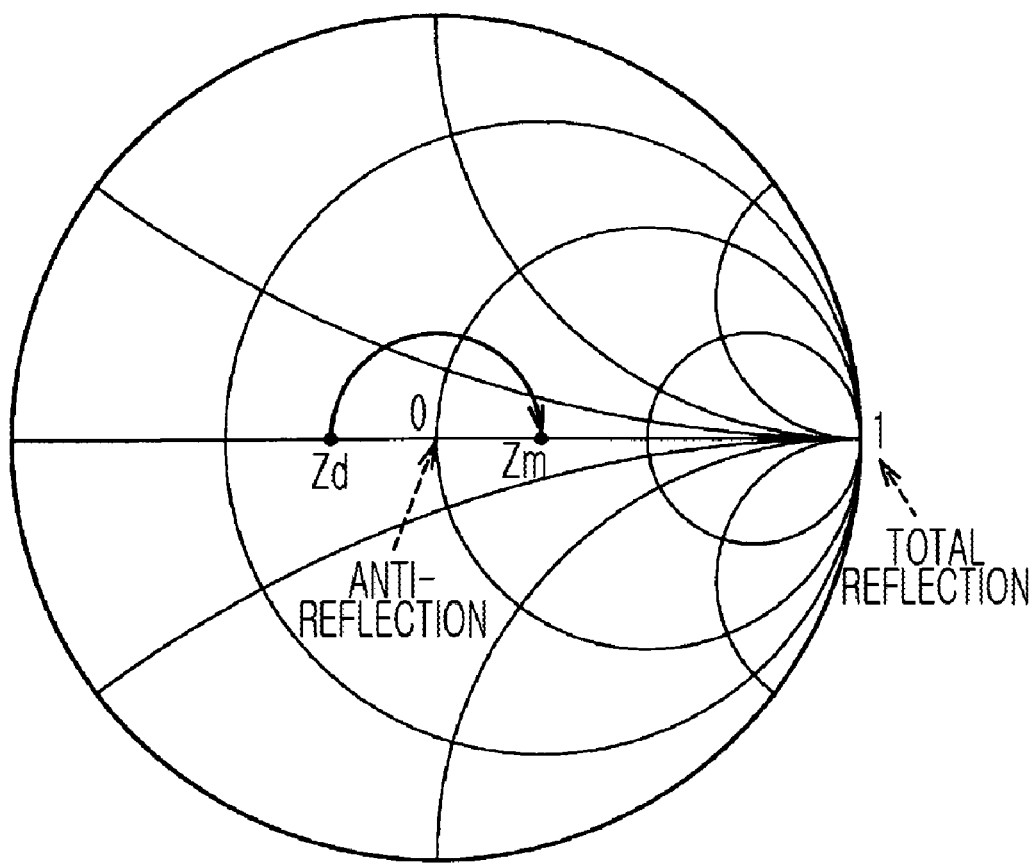
FIG. 9 is a Smith chart for describing impedance matching.

When a length of the low characteristic impedance line is increased, a reflection coefficient observed from a stepped part 610a6 toward the low characteristic impedance line side rotates clockwise on a complex plane (Smith chart) of FIG. 9. When the length of the low characteristic impedance line is adjusted so that the reflection coefficient is a positive real number (on a right side of the complex plane), the impedance observed from a stepped part 610a6 toward the low characteristic impedance line is adjusted from impedance Zd to impedance Zm having a maximum real number, thereby reducing the reflection to the smallest. Here, the anti-reflection is possible if the impedance observed from a stepped part 610a6 toward the low characteristic impedance line is matched to the characteristic impedance of the high characteristic impedance line. Also, when the length of the line is changed to λg/2, the reflection coefficient rotates once on the Smith chart, and thus it is sufficient to adjust the length of the low characteristic impedance line to be λg/2 or lower. In FIG. 9, the length of the low characteristic impedance line is λg/4.

Also in FIG. 7, the metal part 725 and a shield spiral 740 are not disposed at the bottom of the inner conductor 610a, and thus the inner conductor 610a is directly adhered to the metal film 305a in the dent of the dielectric plate. In FIG. 7, a narrowed portion 610a3 is not formed on the inner conductor 610a.

In FIG. 8, the metal part 725 is not disposed, and thus the shield spiral 740 directly contacts the metal film 305a in the dent of the dielectric plate. Also, when the stepped part 610a6 is formed as shown in FIG. 8, the inner conductor 610a and the outer conductor 610b are not tapered.

(Adequate Value of Characteristic Impedance of Input Side of First Coaxial Waveguide)

Assuming that temperature of an inner conductor of a coaxial waveguide is uniformly increased, the characteristic impedance of the input side of the first coaxial waveguide may be any value in the range from 18Ω to 46Ω, and preferably any value in the range from 22Ω to 40Ω. The grounds will now be described.

As described above, when a gas passage is formed in the metal electrode 310 and the metal cover 320 and a gas is introduced by using the metal electrode and the metal cover as a shower plate, a gas passage has to be formed at a location that does not interfere with the first coaxial waveguide or the like, and thus the thickness of the first coaxial waveguide 610 is limited. Also, since a microwave of hundreds of W to several kW has to be transmitted to the first coaxial waveguide 610 so as to excite high density plasma, current density of the inner conductor 610a of the first coaxial waveguide is increased, and thus the inner conductor 610a may be heated up. When the inner conductor 610a of the first coaxial waveguide is heated up, the dielectric ring 710 or the like holding the inner conductor 610a may be deformed or deteriorated, an inner conductor surface may be oxidized, or the inner conductor 610a may be damaged as the inner conductor extends and stress is applied to each portion of the inner conductor 610a.

Maximum power Pmax that is transmitted to a coaxial waveguide may be calculated as follows.

$$P_{max} = \frac{1}{2Z_0} a^2 E_{max}^2 \left\{ \log\left(\frac{b}{a}\right) \right\}^2$$

Here, Emax denotes a maximum electric filed in the coaxial waveguide (electric field in a surface of an inner conductor), and is proportional to an increasing temperature of the inner conductor. A source is from "Basics and Application of Microwave Engineering" by Okada Humiaki, Gakuken Publishing, P. 142.

Figure 12:
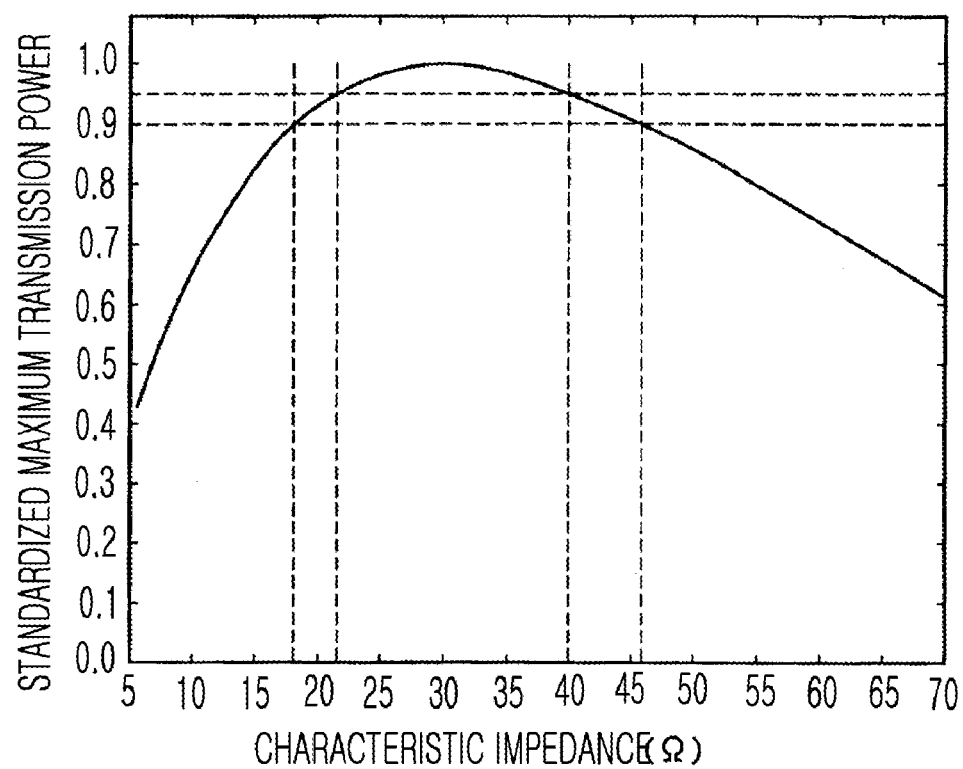
FIG. 12 is a graph showing a relationship between characteristic impedance and maximum transmission power.

FIG. 12 shows a relationship between Pmax and characteristic impedance obtained from the above equation. The ordinate denotes a standardized maximum transmission power when an inner diameter of an outer conductor is uniform. A maximum transmission power is maximized when characteristic impedance is 30Ω. In order to transmit 90% or more of the maximum transmission power, characteristic impedance of the first coaxial waveguide (input side) may be from 18Ω to 46Ω, and preferably, in order to transmit 95% or more of the maximum transmission power, the characteristic impedance may be from 22Ω to 40 Ω.

(Narrowed Portion)

In FIGS. 3 and 4, the inner conductor 610a of the first coaxial waveguide has the narrowed portion 610a3 that is partially narrowed. The narrowed portion 610a3 is series inductance having a predetermined size determined by a diameter and length of the narrowed portion 610a3. While designing the first coaxial waveguide 610, the reflection may be suppressed by forming the narrowed portion 610a3 if required at a desired location of the first coaxial waveguide, when impedance observed from the desired location toward the outside is capacitive.

(Dielectric Ring)

The dielectric ring 710 is parallel capacitance having a predetermined size determined by a thickness or permittivity of the dielectric ring 710. While designing the first coaxial waveguide 610, the reflection may be suppressed by forming the narrowed portion 610a3 if required at a desired location of the first coaxial waveguide, when impedance observed from the desired location toward output side is inductive.

Embodiment 2

Figure 10:
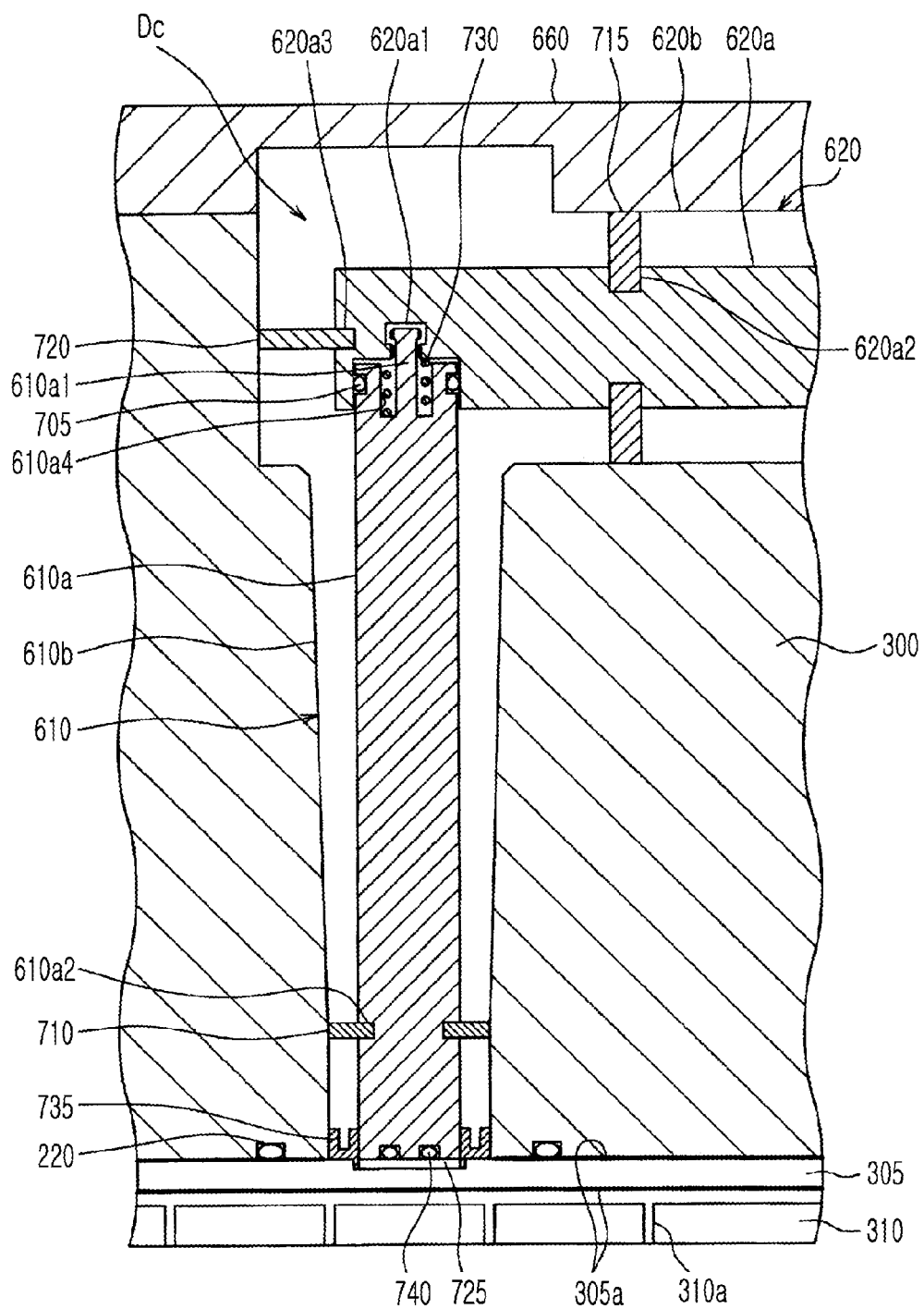
FIG. 10 is a magnified view of a first coaxial waveguide and the vicinity of the first coaxial waveguide, according to an embodiment 2 of the present invention.

Fixation of the inner conductor 610a of the first coaxial waveguide and coaxial waveguide matching, according to a embodiment 2 of the present invention will now be described with reference to FIG. 10. FIG. 10 corresponds to FIG. 3 that is used to describe the embodiment 1. The embodiment 2 is different from the embodiment 1 in the structure of the connecting portion Dc, and that a dielectric ring is disposed near a dielectric plate. Accordingly, the differences will be mainly described, and other descriptions will be omitted.

In the connecting portion Dc according to the embodiment 2, the dielectric rod 720 is inserted into the horizontal hole 620a3 of the inner conductor 620a of the second coaxial waveguide, and accordingly, the inner conductor 620a is supported by the outer conductor 620b. Meanwhile in the present embodiment, since the dielectric rod 720 does not penetrate through the inner conductor 610a of the first coaxial waveguide, it has no function for preventing the inner conductor 610a from falling off. However, in the present embodiment, a thread groove is formed on the bottom of the perpendicular hole 620a1 of the inner conductor 620a of the second coaxial waveguide, while a thread groove is also formed at a head portion of the rod 610a1 at the end of the inner conductor 610a. A thread groove is not formed at the top of the perpendicular hole 620a1, and a hole diameter is larger than a periphery of the rod 610a1. Thus, the head of the rod 610a1 is squeezed into the perpendicular hole 620a1 so as to screw-combine an end portion of the rod 610a1, where the thread groove is formed, to a top of the perpendicular hole 620a1, wherein a thread groove is not formed, thereby fixing the rod 610a1 to the perpendicular hole 620a1. Accordingly, the rod 610a1 may be fixed in such a way that the inner conductor 610a of the first coaxial waveguide is prevented from falling off while moving freely. Also, a catching portion between the rod 610a1 of the inner conductor 610a and the perpendicular hole 620a1 of the inner conductor 620a according to the present embodiment is an example of a catching portion for preventing the inner conductor 610a of the first coaxial waveguide from falling off from the inner conductor 620a of the second coaxial waveguide.

A recess portion 610a4 is formed in the inner conductor 610a of the first coaxial waveguide at the connecting portion Dc, and a metal spring 730 is disposed inside the recess portion 610a4. The metal spring 730 is an example of a spring member for pushing the inner conductor 610a of the first coaxial waveguide to the dielectric plate 305.

The end of the inner conductor 610a of the first coaxial waveguide is inserted into the dent formed at the bottom of the inner conductor 620a of the second coaxial waveguide. The shield spiral 705 is disposed on a contacting surface of the inner conductors 610a and 620a. The shield spiral 705 is an example of a connecting member electrically connecting the inner conductors 610a and 620a.

In addition to the above described dielectric ring 710, a dielectric ring 735 is adhered adjacent to the dielectric plate 305, between the inner conductor 610a and the outer conductor 610b of the first coaxial waveguide. Here, abnormal discharge may be prevented by covering a strong electric field portion near the first coaxial waveguide 610 and the dielectric plate 305 with a dielectric substance.

Also, in FIG. 10, the metal film 305a is not formed on a contacting surface (the dent portion of the dielectric plate 305) of the metal part 725 and the dielectric plate 305.

Embodiment 3

Figure 11:
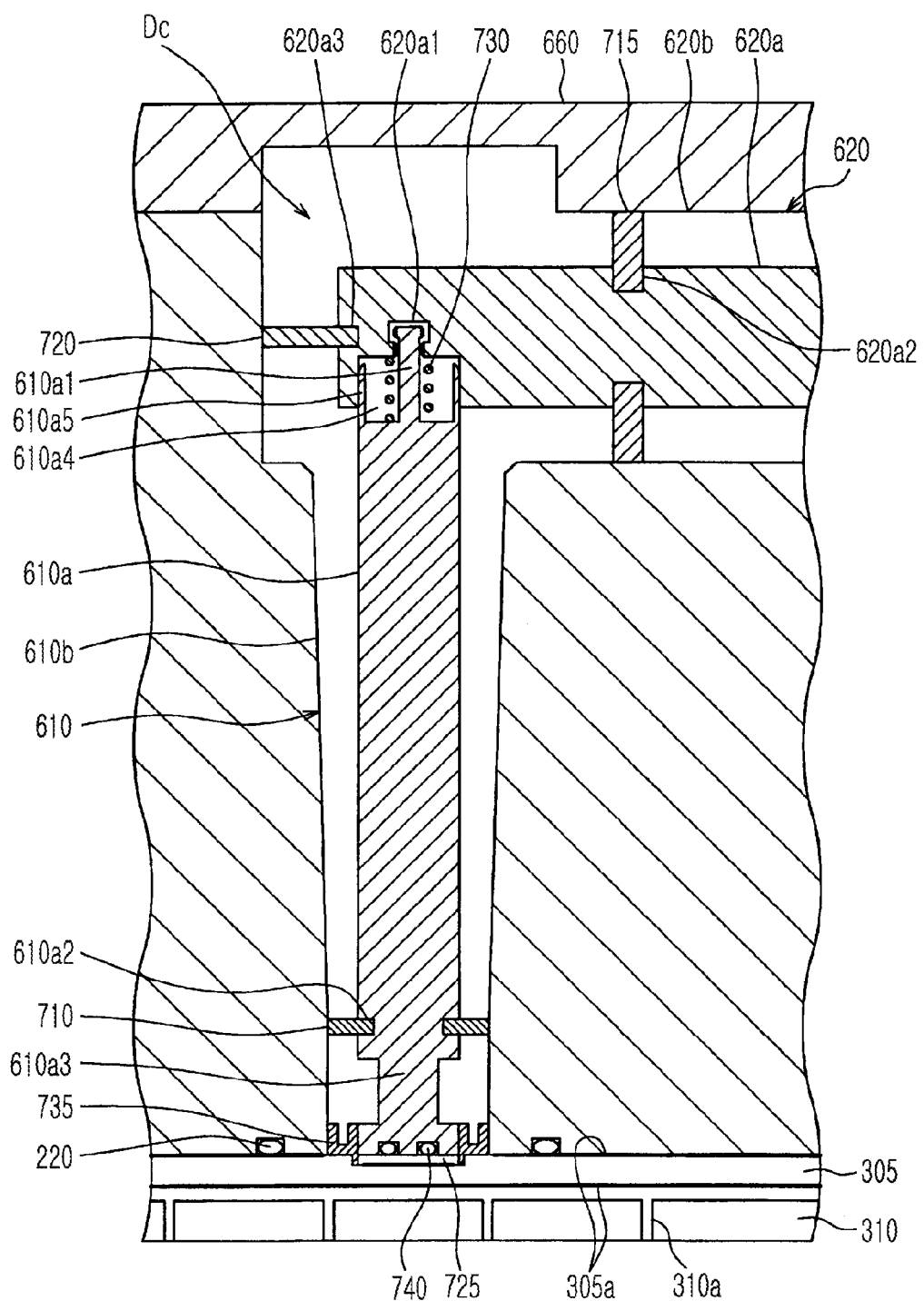
FIG. 11 is a magnified view of a first coaxial waveguide and the vicinity of the first coaxial waveguide, according to an embodiment 3 of the present invention.

Fixation of the inner conductor 610a of the first coaxial waveguide and coaxial waveguide matching, according to a embodiment 3 of the present invention will now be described with reference to FIG. 11. FIG. 11 corresponds to FIG. 3 that is used to describe the embodiment 1 and FIG. 10 that is used to describe the embodiment 2. The embodiment 3 is different from the embodiment 2 in the structure of the connecting portion Dc. Accordingly, the differences will be mainly described, and other descriptions will be omitted.

In the connecting portion Dc according to the embodiment 3, the recess portion 610a4 is formed on the periphery of the rod 610a1 of the inner conductor 610a, and a flat spring 610a5 is formed an outer side of the recess portion 610a4. A shield spiral is not disposed on a catching portion. The flat spring 610a5 is an example of a connecting member electrically connecting the inner conductors 610a and 620a.

The metal spring 730 is disposed on the recess portion 610a4 of the inner conductor 610a of the first coaxial waveguide, and the inner conductor 610a of the first coaxial waveguide is pushed to and adhered to the dielectric plate 305 by an elastic force of the metal spring 730 (an example of a spring member).

In each embodiment described above, a microwave source 900 outputting a microwave of 915 MHz is used, but a microwave source outputting a microwave of 896 MHz, 922 MHz, 2.45 GHz, or the like may be used. Also, the microwave source is an example of an electromagnetic wave source generating an electromagnetic wave for exciting plasma. Examples of the electromagnetic wave source outputting an electromagnetic wave of 100 MHz or more include a magnetron and a high frequency supply source.

Also, a shape of the metal electrode 310 is not limited to a quadrangle, and may be a triangle, a hexagon, or an octagon. Here, shapes of the dielectric plate 305 and the metal cover 320 are identical to the shape of the metal electrode 310. The metal cover 320 or a side cover may or may not be disposed. When the metal cover 320 is not disposed, a gas passage is directly formed on the lid 300. Also, a gas discharging function may not exist since a gas discharging hole does not exist, and a lower shower plate may be formed. The numbers of the metal electrodes 310 and the dielectric plates 305 are not limited to 8, and may be 1 or above.

When the dielectric plate 305 is not coated with the metal film 305a, gaps between the dielectric plate 305 and the lid 300, and between the dielectric plate 305 and the metal electrode 310 may be 0.2 mm or less. The reason will now be described. When discharge is generated in a gap between the dielectric plate 305 and a metal surface adjacent to the dielectric plate 305, a plasma exciting efficiency is remarkably decreased as energy of plasma microwaves is lost, while the dielectric plate 305 or the metal electrode 310 is damaged. When the gap is smaller than a mean free path of electrons, the electrons lose energy by colliding with a wall before energy required for ionization is obtained from a microwave electric field due to a narrow interval, and thus discharge is difficult to generate in the gap. A diameter of a gas passage is determined to a size that does not generate discharge even under a situation that is most easily discharged under an actual working condition.

The mean free path may be obtained according to ua/υc. Here, "ua" denotes an average speed of electrons, and "υc" denotes a collision frequency of electrons. The average speed ua of the electrons may be obtained according to ua=$(8kT/\pi m)^{1/2}$. Here, "k" denotes a Boltzmann constant, "T" denotes an electron temperature, and "m" denotes a mass of the electrons. When an electron temperature for maintaining discharge in a gap is 3 eV, ua=$1.14 \times 10^6$ m/s from the above equation.

When a colliding frequency of electrons and angle-frequency of a microwave are identical, discharge is most easily generated since energy given to the electrons from the microwave is the maximum. When a microwave frequency is 915 MHz and a value of pressure satisfies $\upsilon c=5.75\times10^9$ Hz (about 200 Pa with an argon gas), discharge is most easily generated. Here, a mean free path is 0.20 mm from the above equation. In other words, when a diameter of a gas passage is 0.2 mm or less, plasma is always stably excited without discharge in a gap.

While this invention has been particularly shown and described with reference to exemplary embodiments thereof, the present invention is not limited thereto and it will be understood by those skilled in the art that various changes in form and details may be made therein without departing from the spirit and scope of the invention as defined by the appended claims.

The plasma processing apparatus is not limited to the above described microwave plasma processing apparatus, and may be a apparatus that minutely processes an object to be processed by using plasma, such as a thin-film process, a diffusion process, an etching process, an ashing process, a plasma doping process, or the like.

Also, for example, the plasma processing apparatus according to the present invention may process a large glass substrate, a circular silicon wafer, or a square SOI (Silicon On Insulator) substrate.

The invention claimed is:

1. A plasma processing apparatus for plasma-processing an object to be processed by exciting a gas by using an electromagnetic wave, the plasma processing apparatus comprising:
   a processing container;
   an electromagnetic wave source, which outputs an electromagnetic wave;
   a first coaxial waveguide, which has a structure in which a thickness ratio between an inner conductor and an outer conductor is not uniform along a longitudinal direction and transmits the electromagnetic wave output from the electromagnetic wave source; and
   a dielectric plate, which faces an inner side of the processing container and is adjacent to the first coaxial waveguide to emit the electromagnetic wave transmitted from the first coaxial waveguide into the processing container.

2. The plasma processing apparatus of claim 1, wherein the thickness ratio between the inner conductor and the outer conductor of the first coaxial waveguide is determined in such a way that characteristic impedance of an electromagnetic wave input side of the first coaxial waveguide is higher than characteristic impedance of an electromagnetic wave output side of the first coaxial waveguide.

3. The plasma processing apparatus of claim 1, wherein a thickness of an input side of the inner conductor of the first coaxial waveguide is thinner than a thickness of an output side of the inner conductor of the first coaxial waveguide.

4. The plasma processing apparatus of claim 3, wherein the inner conductor of the first coaxial waveguide continuously becomes thicker from the input side toward the output side along the longitudinal direction of the first coaxial waveguide.

5. The plasma processing apparatus of claim 1, wherein a thickness of an input side of the outer conductor of the first coaxial waveguide is thicker than a thickness of an output side of an outer conductor of the first coaxial waveguide.

6. The plasma processing apparatus of claim 5, wherein the outer conductor of the first coaxial waveguide continuously becomes narrower from the input side to the output side along the longitudinal direction of the first coaxial waveguide.

7. The plasma processing apparatus of claim 1, wherein a stepped part is formed on at least one of the inner conductor and the outer conductor of the first coaxial waveguide, and the thickness ratio between the inner conductor and the outer conductor of the fist coaxial waveguide discontinuously changes by the stepped part.

8. The plasma processing apparatus of claim 1, wherein characteristic impedance of the input side of the first coaxial waveguide has a value in the range from 18Ω to 46Ω.

9. The plasma processing apparatus of claim 8, wherein the characteristic impedance of the input side of the first coaxial waveguide has a value in the range from 22Ω to 40Ω.

10. The plasma processing apparatus of claim 1, wherein the inner conductor of the first coaxial waveguide has a narrowed portion that is partially narrowed.

11. The plasma processing apparatus of claim 1, wherein a dielectric ring is disposed adjacent to the dielectric plate, between the inner conductor and the outer conductor of the first coaxial waveguide.

12. The plasma processing apparatus of claim 1, wherein a first dielectric supporting member is disposed between the inner conductor and the outer conductor of the first coaxial waveguide, and the first dielectric supporting member is inserted into a groove formed on a periphery of the inner conductor of the first coaxial waveguide.

13. The plasma processing apparatus of claim 1, further comprising:
   a second coaxial waveguide, which is connected to the first coaxial waveguide and transmits the electromagnetic wave to the first coaxial waveguide; and
   a spring member, which is disposed at a connecting portion between the inner conductor of the first coaxial waveguide and an inner conductor of the second coaxial waveguide and directly or indirectly pushes the inner conductor of the first coaxial waveguide to the dielectric plate.

14. The plasma processing apparatus of claim 13, wherein a connecting member, which electrically connects the inner conductor of the first coaxial waveguide and the inner conductor of the second coaxial waveguide, is disposed at the connecting portion between the inner conductor of the first coaxial waveguide and the inner conductor of the second coaxial waveguide.

15. The plasma processing apparatus of claim 13, wherein the inner conductor of the second coaxial waveguide is thicker than the inner conductor of the first coaxial waveguide.

16. The plasma processing apparatus of claim 13, wherein the connecting portion has a clearance for changing an angle of the inner conductor of the first coaxial waveguide with respect to the inner conductor of the second coaxial waveguide.

17. The plasma processing apparatus of claim 13, wherein a second dielectric supporting member is disposed between the inner conductor and an outer conductor of the second coaxial waveguide, and the second dielectric supporting member is inserted into on a groove formed on a periphery of the inner conductor of the second coaxial waveguide.

18. The plasma processing apparatus of claim 13, wherein a dielectric rod is disposed between the inner conductor and the outer conductor of the second coaxial waveguide near the connecting portion, and the dielectric rod is inserted into a hole formed on the inner conductor of the second coaxial waveguide.

19. The plasma processing apparatus of claim 13, wherein a catching portion, which prevents the inner conductor of the first coaxial waveguide from falling from the inner conductor of the second coaxial waveguide, is formed in the connecting portion.

20. The plasma processing apparatus of claim 1, wherein a metal part is disposed between and adjacent to the inner conductor of the first coaxial waveguide and the dielectric plate.

21. The plasma processing apparatus of claim 13, wherein, in the connecting portion, the characteristic impedance of the first coaxial waveguide and the characteristic impedance of the second coaxial waveguide are identical.

22. A plasma processing method comprising:
   introducing a gas to an inner side of a processing container;
   outputting an electromagnetic wave from an electromagnetic wave source;
   transmitting the output electromagnetic wave to a first coaxial waveguide having a structure in which a thickness ratio between an inner conductor and an outer conductor is not uniform along a longitudinal direction;
   emitting the electromagnetic wave received from the first coaxial waveguide, from a dielectric plate, which faces an inner side of the processing container and is adjacent to the first coaxial waveguide, to the inner side of the processing container; and
   plasma-processing an object to be processed by exciting the introduced gas, by using the emitted electromagnetic wave.

* * * * *